United States Patent
Sato et al.

(10) Patent No.: US 7,928,972 B2
(45) Date of Patent: Apr. 19, 2011

(54) DISPLAY DEVICE

(75) Inventors: Hideo Sato, Hitachi (JP); Teruaki Saito, Mobara (JP); Shigeyuki Nishitani, Mobara (JP)

(73) Assignee: Hitachi Displays, Ltd., Chiba (JP)

( * ) Notice: Subject to any disclaimer, the term of this patent is extended or adjusted under 35 U.S.C. 154(b) by 818 days.

(21) Appl. No.: 11/943,708

(22) Filed: Nov. 21, 2007

(65) Prior Publication Data
US 2008/0116495 A1   May 22, 2008

(30) Foreign Application Priority Data
Nov. 22, 2006   (JP) .................. 2006-315717

(51) Int. Cl.
G06F 3/038   (2006.01)
(52) U.S. Cl. ........................ 345/207; 345/102
(58) Field of Classification Search .................. 345/207, 345/102, 90, 87, 84, 55, 30
See application file for complete search history.

(56) References Cited

U.S. PATENT DOCUMENTS

| | | | |
|---|---|---|---|
| 6,552,712 B1* | 4/2003 | Koizumi | 345/104 |
| 7,129,938 B2* | 10/2006 | Naugler, Jr. | 345/207 |
| 7,502,001 B2* | 3/2009 | Fish et al. | 345/81 |
| 7,595,795 B2* | 9/2009 | Shin et al. | 345/207 |
| 2003/0174118 A1* | 9/2003 | Sato et al. | 345/100 |

FOREIGN PATENT DOCUMENTS

| | | |
|---|---|---|
| JP | 05-164609 | 6/1993 |
| JP | 2002-072992 | 3/2002 |
| JP | 2003-021821 | 1/2003 |

* cited by examiner

Primary Examiner — Richard Hjerpe
Assistant Examiner — Jeffrey Parker
(74) Attorney, Agent, or Firm — Antonelli, Terry, Stout & Kraus, LLP.

(57) ABSTRACT

The present invention provides a display device having an illuminance detection circuit. The illuminance detection circuit includes: a photosensor which changes an optical current in response to illuminance of an external light; a capacitor which discharges a charge when the optical current flows in the photosensor; a comparator which compares a voltage at one end of the capacitor and a comparison reference voltage; a switching circuit which is connected to one end of the capacitor and charges the capacitor in response to a level of an output signal of the comparator; and a selection circuit which applies either a first voltage or a second voltage to the other end of the capacitor in response to the level of the output signal of the comparator.

15 Claims, 6 Drawing Sheets

DISPLAY DEVICE

The present application claims priority from Japanese applications JP2006-315717 filed on Nov. 22, 2006, the content of which is hereby incorporated by reference into this application.

BACKGROUND OF THE INVENTION

The present invention relates to a display device such as a liquid crystal display device, and more particularly to a display device which includes an illuminance detection circuit.

In general, a liquid crystal display device is rarely used in a pitch-dark state with no external light. That is, the liquid crystal display device is used in a state that an external light in any form, for example, a natural light or a light of an indoor illumination lamp is radiated to a liquid crystal panel. Under such a circumstance, patent documents 1, 2 (JP-A-2003-21821, JP-A-2002-72992) describe techniques for controlling the brightness of a backlight by measuring the brightness of surrounding of the liquid crystal display panel (that is, illuminance of an external light). In patent document 1, when the surrounding of the liquid crystal display panel is bright, the brightness of the backlight is increased so as to allow a user to easily look at the liquid crystal display panel. On the other hand, when the surrounding of the liquid crystal panel is dark, the user can sufficiently look at the liquid crystal display panel even when the liquid crystal display panel is dark and hence, the brightness of the backlight is lowered to suppress the power consumption.

Further, patent document 3 (JP-A-5-164609) discloses a technique which uses a Schmidt inverter as an illuminance-frequency converting circuit for converting illuminance measured by a photosensor into frequency.

SUMMARY OF THE INVENTION

In the above-mentioned illuminance-frequency converting circuit described in patent document 3, an output frequency is inversely proportional to a voltage and an integration capacitance (C) having a hysteresis characteristic. Accordingly, the hysteresis characteristic is required to be stable. However, it is difficult for the hysteresis characteristic of the Schmidt inverter to acquire the sufficient accuracy.

Further, when the photosensor is formed using a thin film transistor (TFT) having a semiconductor layer made of low-temperature polysilicon, the photosensor becomes large-sized thus increasing a parasitic capacitance. This parasitic capacitance is connected with an integration capacitance (C) in parallel equivalently. Accordingly, the output frequency is dependent on the parasitic capacitance and hence, the illuminance-frequency conversion circuit cannot acquire the sufficient accuracy also in this point.

The present invention has been made to overcome the above-mentioned drawbacks of the related art, and it is an object of the present invention to provide a technique which can, in a display device having an illuminance detection circuit, enhances the detection accuracy even when illuminance of an external light is low while preventing an output frequency of the illuminance detection circuit from being dependent on the parasitic capacitance.

The above-mentioned and other objects and novel features of the present invention will become apparent from the description of the specification and attached drawings.

To briefly explain the summary of typical inventions among the inventions disclosed in this specification, they are as follows.

(1) The present invention provides a display device having an illuminance detection circuit, wherein the illuminance detection circuit includes: a photosensor which changes an optical current in response to illuminance of an external light; a capacitor which discharges a charge when the optical current flows in the photosensor; a comparator which compares a voltage at one end of the capacitor and a comparison reference voltage; a switching circuit which is connected to one end of the capacitor and charges the capacitor in response to a level of an output signal of the comparator; and a selection circuit which applies either a first voltage or a second voltage to the other end of the capacitor in response to the level of the output signal of the comparator.

(2) In the constitution (1), a second capacitor is connected to one end of the capacitor.

(3) In the constitution (1) or (2), the display device includes a transistor which is connected between one end of the capacitor and the photosensor, and a charge of the capacitor is discharged by the photosensor through the transistor.

(4) In the constitution (1) or (2), the display device includes a source follower which is connected between one end of the capacitor and the comparator.

(5) The present invention provides a display device having an illuminance detection circuit, wherein the illuminance detection circuit includes: a photosensor which changes an optical current in response to illuminance of an external light, a capacitor which discharges a charge when the optical current flows in the photosensor, an integration circuit which integrates a voltage at one end of the capacitor; a comparator which compares an output of the integration circuit and a comparison reference voltage, a switching circuit which is connected to one end of the capacitor and charges the capacitor in response to a level of an output signal of the comparator; and a selection circuit which applies either a first voltage or a second voltage to the other end of the capacitor in response to the level of the output signal of the comparator.

(6) In the constitution (5), the integration circuit includes an operational amplifier, and a second capacitor which is connected between an inverted input terminal and an output terminal of the operational amplifier.

(7) In any one of the constitutions (1) to (6), the display device includes a plurality of pixels each of which has a thin film transistor, the photosensor is formed on the same substrate on which the thin film transistors of the respective pixels are formed, and other circuits are formed of a circuit which is formed in the inside of a semiconductor chip.

(8) In any one of the constitutions (1) to (4), the display device includes a plurality of pixels each of which includes a thin film transistor, the photosensor and the capacitor are formed on the same substrate on which the thin film transistors of the respective pixels are formed, and other circuits are formed of a circuit formed in the inside of the semiconductor chip.

(9) In any one of the constitutions (1) to (4), the display device includes a plurality of pixels each of which includes a thin film transistor, the photosensor, the capacitor and the switching circuit are formed on the same substrate on which the thin film transistors of the respective pixels are formed, and other circuits are formed of a circuit formed in the inside of the semiconductor chip.

(10) In the constitution (9), the photosensor and the switching circuit are constituted of the thin film transistor of a single channel.

(11) In any one of the constitutions (1) to (10), the photosensor is arranged in a dummy pixel part around a display part.

(12) In any one of the constitutions (1) to (11), the switching circuit is turned off and the selection circuit applies the first voltage to the other end of the capacitor when the level of the output signal of the comparator is high, and the switching circuit is turned on and the selection circuit applies the second voltage to the other end of the capacitor when the level of the output signal of the comparator is low.

(13) In the constitution (12), the first voltage is a reference voltage and the first voltage is higher than the second voltage.

(14) In any one of the constitutions (1) to (13), the display device includes a dark current correcting transistor which corrects a dark current of the photosensor.

(15) In the constitution (14), the photosensor and the dark current correcting transistor are driven with a dedicated power source voltage.

The effect obtained by the typical invention of the inventions described in this specification, is briefly explained below.

By the display device having the illuminance detection circuit of the invention, the detection accuracy can be enhanced without the output frequency of the illuminance detection circuit being dependent on the parasitic capacitance, even when illuminance of the external light is low.

DESCRIPTION OF THE PREFERRED EMBODIMENTS

Hereinafter, an embodiment in which the present invention is applied to a liquid crystal display device is explained in conjunction with drawings.

Here, in all drawings for explaining the embodiment, parts having identical functions are given same symbols, and their repeated explanation is omitted.

Figure 1:
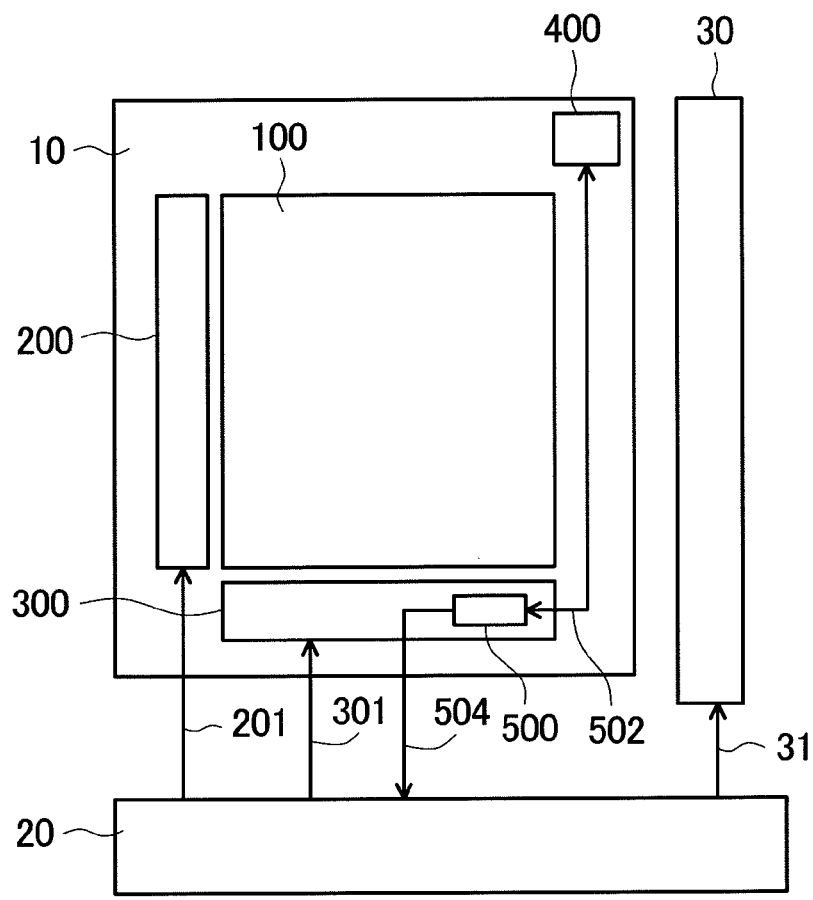
FIG. 1 is a block diagram showing the schematic constitution of a liquid crystal display device according to an embodiment of the present invention.

FIG. 1 is a block diagram showing the schematic constitution of a liquid crystal display device according to the embodiment of the present invention.

The liquid crystal display device according to this embodiment is constituted of a liquid crystal display panel 10, a control circuit 20 and a backlight 30.

The liquid crystal display panel 10 includes a display part 100, a gate circuit 200, a drain circuit 300, a photosensor part 400, and a photosensor circuit 500.

Here, the display part 100, the gate circuit 200 and the photosensor part 400 are constituted of elements which are formed on one substrate (for example, a glass substrate) of the liquid crystal display panel 10. The drain circuit 300 and the photosensor circuit 500 are formed of elements on a semiconductor chip. Further, the semiconductor chips which form the drain circuit 300 and the photosensor circuit 500 are mounted on one substrate of the liquid crystal display panel 10 by a COG method.

The control circuit 20 outputs a control signal 201 to the gate circuit 200, outputs a control signal 301 to the drain circuit 300, and outputs a control signal 31 to the backlight 30. The photosensor circuit 500 is connected with the photosensor part 400 using input/output signals 502 and, at the same time, outputs a photosensor signal 504 to the control circuit 20.

The liquid crystal display device of this embodiment includes an illuminance detection circuit formed of the photosensor part 400 and the photosensor circuit 500. The photosensor part 400 includes at least one photosensor.

The display part 100 includes a plurality of pixels each of which has a thin film transistor, while the photosensor of the photosensor part 400 is arranged on a dummy pixel part around the display part 100.

Figure 2:
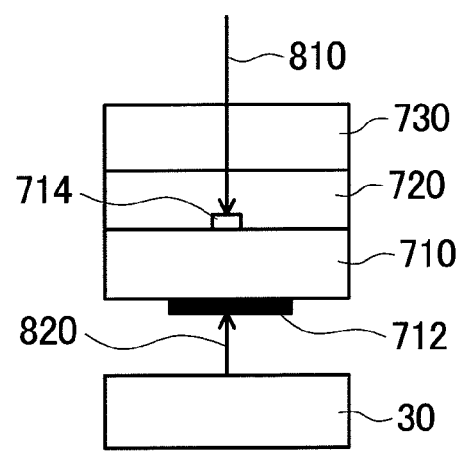
FIG. 2 is a view showing the cross-sectional structure of one example of a photosensor part shown in FIG. 1.

FIG. 2 is a view showing the cross-sectional structure of one example of the photosensor part 400 shown in FIG. 1.

The liquid crystal display panel 10 includes a TFT substrate 710 on which thin film transistors (TFT), pixel electrodes and the like are formed, a CF substrate (counter substrate) 730 on which color filters and the like are formed, and liquid crystal 720 which is sandwiched between the TFT substrate 710 and the CF substrate 730. The photosensor 714 is arranged on the TFT substrate 710. Further, the backlight 30 is arranged below the TFT substrate 710.

An external light 810 is incident on the photosensor 714 from the direction of the CF substrate 730, and a backlight light 820 is incident on light-blocking film 712 from the direction of the TFT substrate 710.

The photosensor 714 adopts the diode-connected structure of the thin film transistor, that is, a parasitic photo diode or a diode having the PIN structure.

Figure 3A:
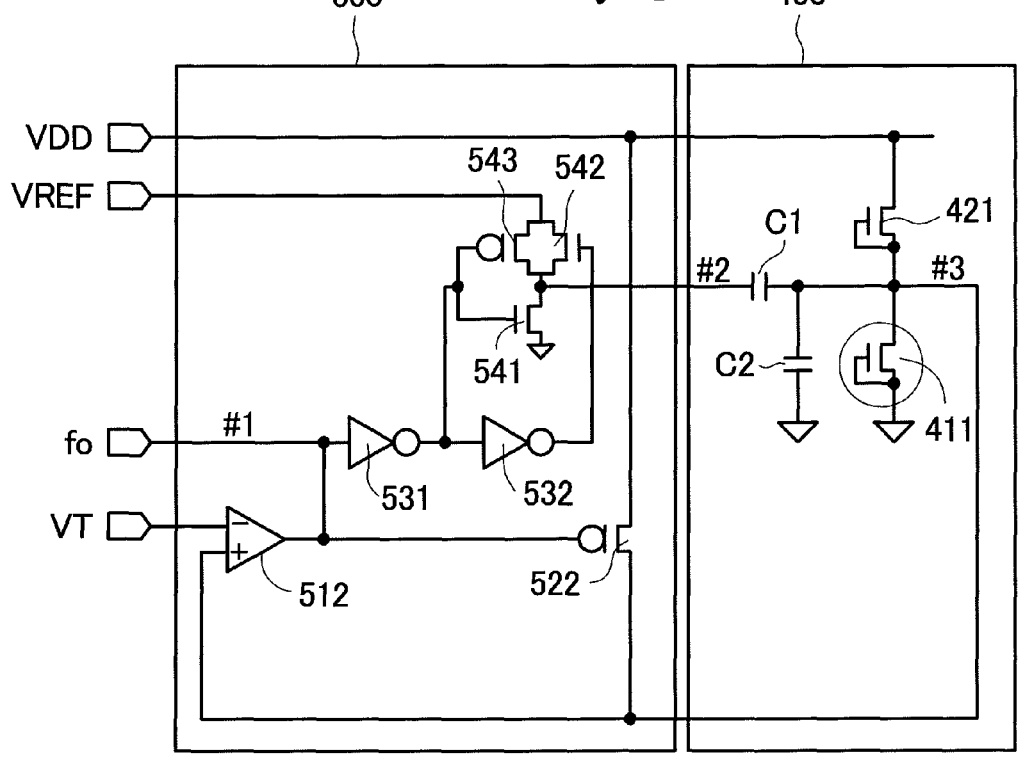
FIG. 3A is a circuit diagram showing one example of the circuit constitution of the photosensor part and a photosensor circuit shown in FIG. 1.

FIG. 3A is a circuit diagram showing one example of the circuit constitution of the photosensor part 400 and the photosensor circuit 500 shown in FIG. 1.

The photosensor part 400 is constituted of the photosensor 411, capacitors (C1, C2) and a dark current correction transistor 421.

The photosensor circuit 500 is constituted of PMOS transistors (522, 543), NMOS transistors (541, 542), a comparator 512 and inverters (531, 532).

The circuit shown in FIG. 3A includes a negative feedback loop and a positive feedback loop. The negative feedback loop is constituted of a comparator 512 and the PMOS transistor 522, while the positive feedback loop is constituted of the comparator 512, the inverters (531, 532), the NMOS transistors (541, 542) and the capacitor C1.

Figure 3B:
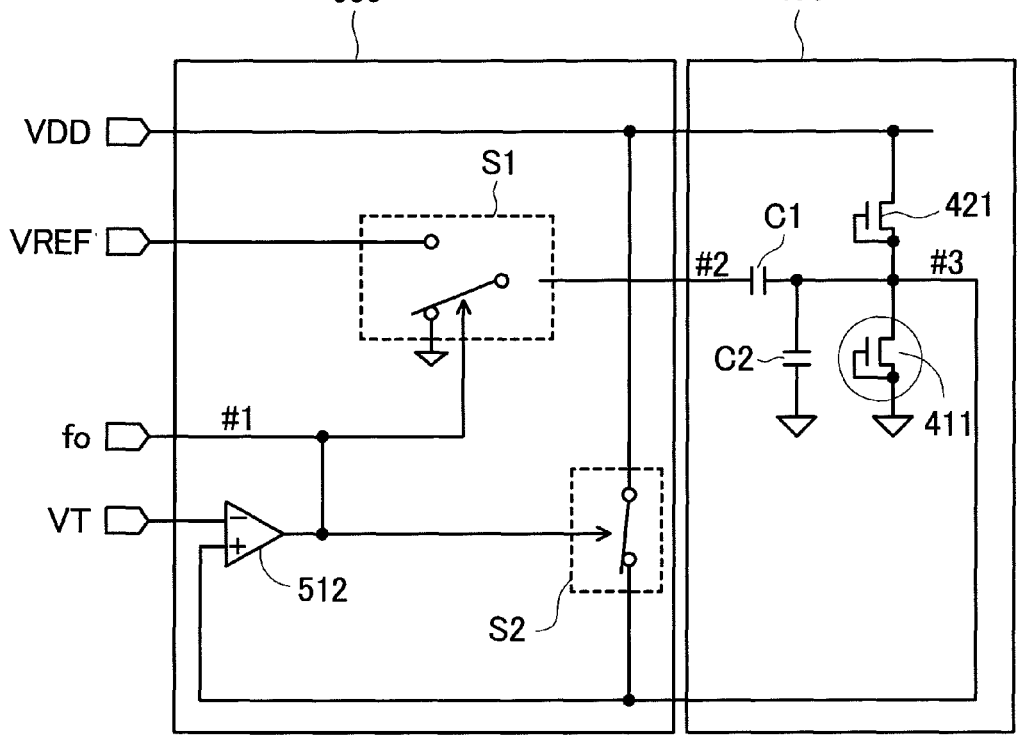
FIG. 3B is a circuit diagram which shows the circuit shown in FIG. 3A in a generic concept.

FIG. 3B is a circuit diagram which shows the circuit shown in FIG. 3A in a generic concept. The invertors (531, 532), a PMOS transistor 543 and the NMOS transistors (541, 542) shown in FIG. 3A correspond to a selection circuit S1 shown in FIG. 3B, while the PMOS transistor 522 shown in FIG. 3A corresponds to a switching circuit S2 shown in FIG. 3B.

The photosensor 411 is formed of the diode-connected N-type thin film transistor which is formed on the first substrate and has a semiconductor layer made of low-temperature polysilicon.

Between a drain and a source of the thin film transistor which constitutes the photosensor 411, an optical current ip corresponding to illuminance of an external light and a dark current id which is not dependent on illuminance of an external light flow. The dark current correction transistor 421 is an N-type thin film transistor formed on the first substrate and having a semiconductor layer made of low-temperature poly silicon. A gate of the dark current correction transistor 421 has the same length and the same width as the gate of the photosensor 411.

Further, the dark current correction transistor 421 also adopts the diode-connected structure. However, the dark current correction transistor 421 differs from the photosensor 411 with respect to a point that the dark current correction transistor 421 is arranged at a position where an external light is blocked. This blocking of light is performed by a black mask formed on the CF substrate 730, for example.

Accordingly, only the dark current id which is not dependent on illuminance of an external light flows between a drain and a source of the dark current correction transistor 421 and hence, by connecting the dark current correction transistor 421 and the photosensor 411 in series, a dark current amount which flows in the photosensor 411 can be canceled.

Figure 4:
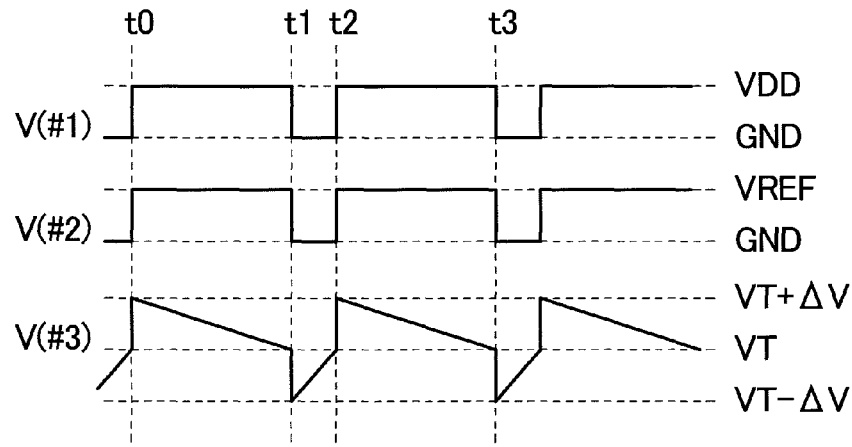
FIG. 4 is a timing chart of the circuit shown in FIG. 3A.

FIG. 4 is a timing chart of the circuit shown in FIG. 3A.

Symbols V (#1), V (#2), V (#3) shown in FIG. 4 respectively indicate voltages at an inner node (#1), an inner node (#2), an inner node (#3), symbol VDD indicates a power source voltage inputted to a power source terminal, a symbol VREF indicates a reference voltage inputted to a reference voltage terminal, and symbol VT indicates a comparison reference voltage inputted to a comparison reference voltage terminal.

During a period from a point of time t0 to a point of time t1, the voltage V (#3) at the node (#3) is larger than the comparison reference voltage VT and hence, an output of the comparator 512 assumes "H level (hereinafter, simply referred to as H)", and the voltage V (#1) at the node (#1) also assumes "H". Accordingly, the PMOS transistor 543 and the NMOS transistor 542 shown in FIG. 3A are turned on, and the NMOS transistor shown in FIG. 3A is turned off. That is, the selection circuit S1 shown in FIG. 3B selects the reference voltage VREF and hence, the voltage V (#2) at the node (#2) becomes the reference voltage VREF.

Further, during a period from the point of time t0 to a point of time t1, the PMOS transistor 522 shown in FIG. 3A is turned off. That is, the switching circuit S2 shown in FIG. 3B is turned off.

Charges of the capacitors (C1, C2) are discharged in response to an optical current of the photosensor 411 and hence, the voltage V (#3) at the node (#3) is monotonously decreased as shown in FIG. 4.

When the voltage V (#3) at the node (#3) at the point of time t1 becomes smaller than the comparison reference voltage VT, an output of the comparator 512 assumes "Low level (hereinafter, simply referred to as L)", and the voltage V (#1) at the node (#1) also assumes "L".

Accordingly, the PMOS transistor 543 and the NMOS transistor 542 shown in FIG. 3A are turned off and the NMOS transistor 541 shown in FIG. 3A is turned on. That is, the selection circuit S1 shown in FIG. 3B selects a ground voltage GND and hence, the voltage V (#2) at the node (#2) becomes the ground voltage GND.

As a result, the voltage V (#3) at the node (#3) is decreased from the comparison reference voltage VT by a voltage ΔV which is acquired by dividing the reference voltage VREF using the capacitors (C1, C2). Here, the voltage ΔV is expressed by a following formula (1).

$$\Delta V = VREF \times C1/(C1+C2) \tag{1}$$

Further, during a period from the point of time t1 to a point of time t2, the voltage V (#1) at the node (#1) assumes "L" and hence, the PMOS transistor 522 is turned on. That is, the switching circuit S2 shown in FIG. 3A is turned on. As a result, the capacitors (C1, C2) are rapidly charged through the switching circuit S2, and the voltage V (#3) at the node (#3) is elevated.

When the voltage V (#3) at the node (#3) at the point of time t2 becomes larger than the comparison reference voltage VT, the output of the comparator 512 assumes "H", and the voltage V (#1) at the node (#1) also assumes "H". Accordingly, the PMOS transistor 543 and the NMOS transistor 542 shown in FIG. 3A are turned on and the NMOS transistor 541 shown in FIG. 3A is turned off. That is, the selection circuit S1 shown in FIG. 3B selects a reference voltage VREF and hence, the voltage V (#2) at the node (#2) becomes the reference voltage VREF.

As a result, the voltage V (#3) at the node (#3) is increased from the comparison reference voltage VT by a voltage ΔV which is acquired by dividing the reference voltage VREF using the capacitors (C1, C2). The manner of operation of the circuit at a point of time t3 is substantially equal to the manner of operation of the circuit at the point of time t1.

Further, during a period from the point of time t2 to the point of time t3, the PMOS transistor 522 shown in FIG. 3A is turned off. That is, the switching circuit S2 shown in FIG. 3B is turned off.

Here, the capacitors (C1, C2) are charged in response to an ON current ion of the PMOS transistor 522 during the period from the point of time t1 to the point of time t2, and is discharged in response to an optical current ip during the period from the point of time t2 to the point of time t3.

As a result, a time t12 from the point of time t1 to the point of time t2 and a time t23 from the point of time t2 to the point of time t3 are expressed by following formulae (2), (3).

$$t12 = (C1+C2) \times \Delta V / \text{ion} \tag{2}$$
$$= C1 \times VREF / \text{ion}$$

$$t23 = (C1+C2) \times \Delta V / ip \tag{3}$$
$$= C1 \times VREF / ip$$

As can be understood form these formulae (2), (3), the time t12 is inversely proportional to the ON current ion of the PMOS transistor 522, and the time t23 is inversely proportional to the optical current ip.

Here, by setting the relationship between the ON current ion and the optical current ip to ion >>ip, a frequency fout of an output fo can be expressed by a following formula.

$$fout = ip/(C1 \times VREF) \tag{4}$$

As can be understood from the formula (4), the output frequency fout is proportional to the optical current ip and is inversely proportional to the reference voltage VREF and the capacitor C1.

Further, it is also understood that since the output frequency fout is not dependent on the capacitor C2, the output frequency fout is not influenced by a parasitic capacitor connected to the node (#3).

Further, as can be understood from the above-mentioned formula (1), amplitude of the voltage at the node (#3) can be reduced using the capacitor C2. The capacitor C2 is an indispensable element for setting the voltage at the node (#3) within a range of supplied power source voltage.

Figure 5:
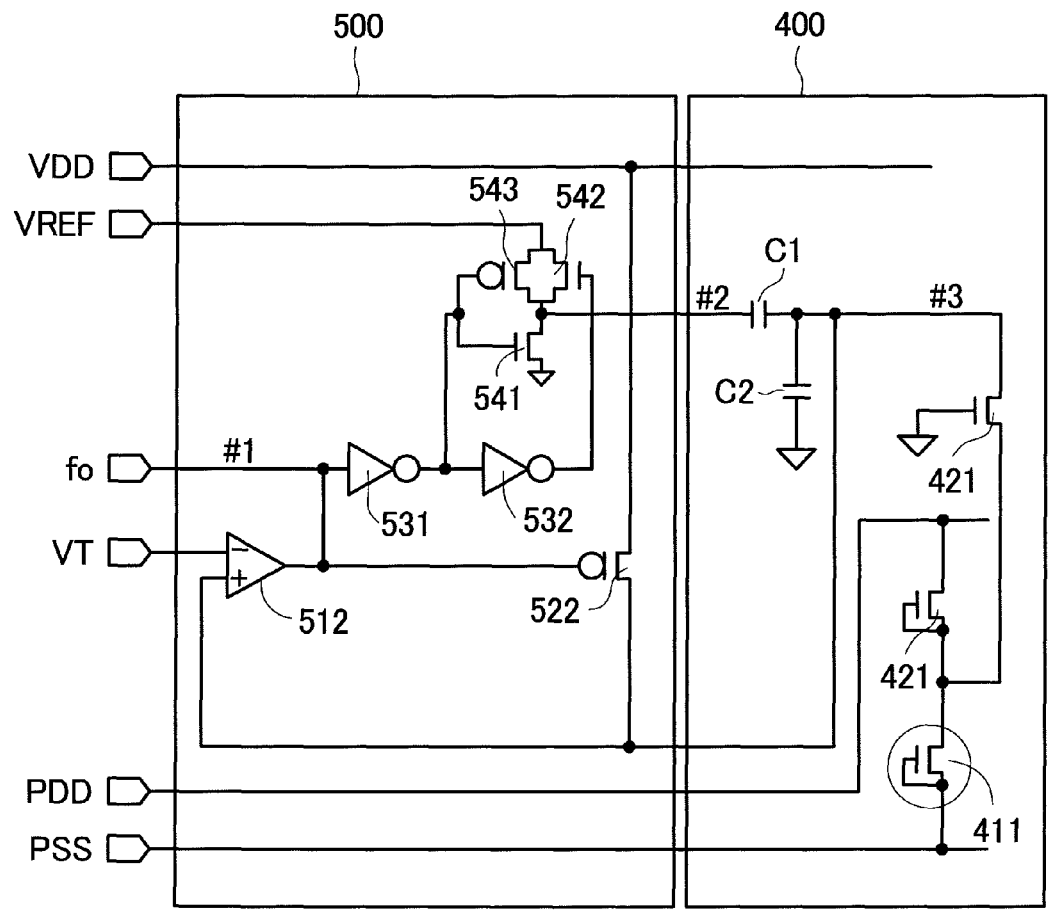
FIG. 5 is a circuit diagram showing another example of the circuit constitution of the photosensor part and the photosensor circuit shown in FIG. 1.

FIG. 5 is a circuit diagram showing another example of the circuit constitution of the photosensor part 400 and the photosensor circuit 500 shown in FIG. 1.

The circuit constitution shown in FIG. 5 differs from the circuit constitution shown in FIG. 3A with respect to a point that an NMOS transistor 461 having a gate to which the ground voltage GND is applied is added and, at the same time, as dedicated power source voltages for driving the photosensor 411 and the dark current correction transistor 421, a source voltage PSS of the photosensor 411 and a drain voltage PDD of the dark current correction transistor 421 are supplied.

Due to the circuit constitution shown in FIG. 5, the respective terminal voltages of the photosensor 411 and the dark current correction transistor 421 become DC voltages and hence, the accuracy of dark current correction can be enhanced. Further, the drive voltages of the photosensor 411 and the dark current correction transistor 421 are set based on the source voltage PSS and the drain voltage PDD and hence, the accuracy of dark current correction can be further enhanced.

Further, by adding the NMOS transistor 461 having the cascade connection, the fluctuation of the voltage applied to the photosensor 411 can be decreased and hence, the photosensor 411 can acquire an output which exhibits more excellent linearity.

Figure 6:
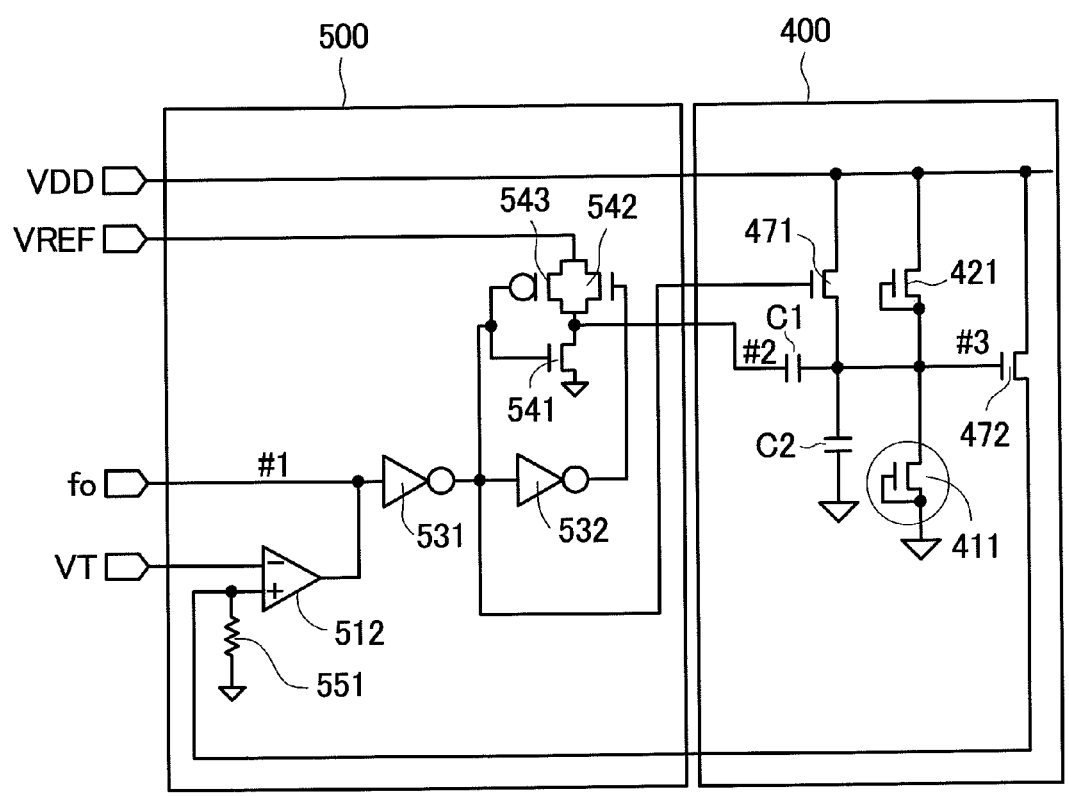
FIG. 6 is a circuit diagram showing another example of the circuit constitution of the photosensor part and the photosensor circuit shown in FIG. 1.

FIG. 6 is a circuit diagram showing another example of the circuit constitution of the photosensor part 400 and the photosensor circuit 500 shown in FIG. 1.

The circuit constitution shown in FIG. 6 differs from the circuit constitution shown in FIG. 3A with respect to a point that an NMOS transistor 471 and an NMOS transistor 472 are added to the photosensor part 400, the PMOS transistor 522 of the photosensor circuit 500 is deleted, and a resistance 551 is added to the photosensor circuit 500.

The NMOS transistor 471 added to the photosensor part 400 is configured to operate so as to charge the capacitors (C1, C2), and the NMOS transistor 472 is configured to operate as a source follower circuit for amplifying the voltage of the node (#3) using a buffer amplifier. Further, the resistance 511 added to the photosensor circuit 500 is a load resistance of the NMOS transistor 472 which operates as the above-mentioned source follower circuit.

According to the circuit constitution shown in FIG. 6, by arranging the NMOS transistor 471 which functions as a switching circuit for charging in the photosensor part 400 formed on the first substrate, the general-use property of the photosensor circuit 500 formed in the inside of the semiconductor chip can be enhanced.

Further, by arranging the source follower circuit (NMOS transistor 472) in the photosensor part 400, a line length of the node (#3) can be shortened and hence, it is possible to decrease the influence of noises generated by a peripheral circuit.

In this manner, according to the circuit constitution shown in FIG. 6, the NMOS transistor 471 which functions as the photosensor 411, the integration capacitor C1 and the switching element for charging can be formed on the first substrate and hence, the transistor formed on the first substrate can be formed by a single channel process having a small number of process steps whereby the productivity can be enhanced.

Figure 7:
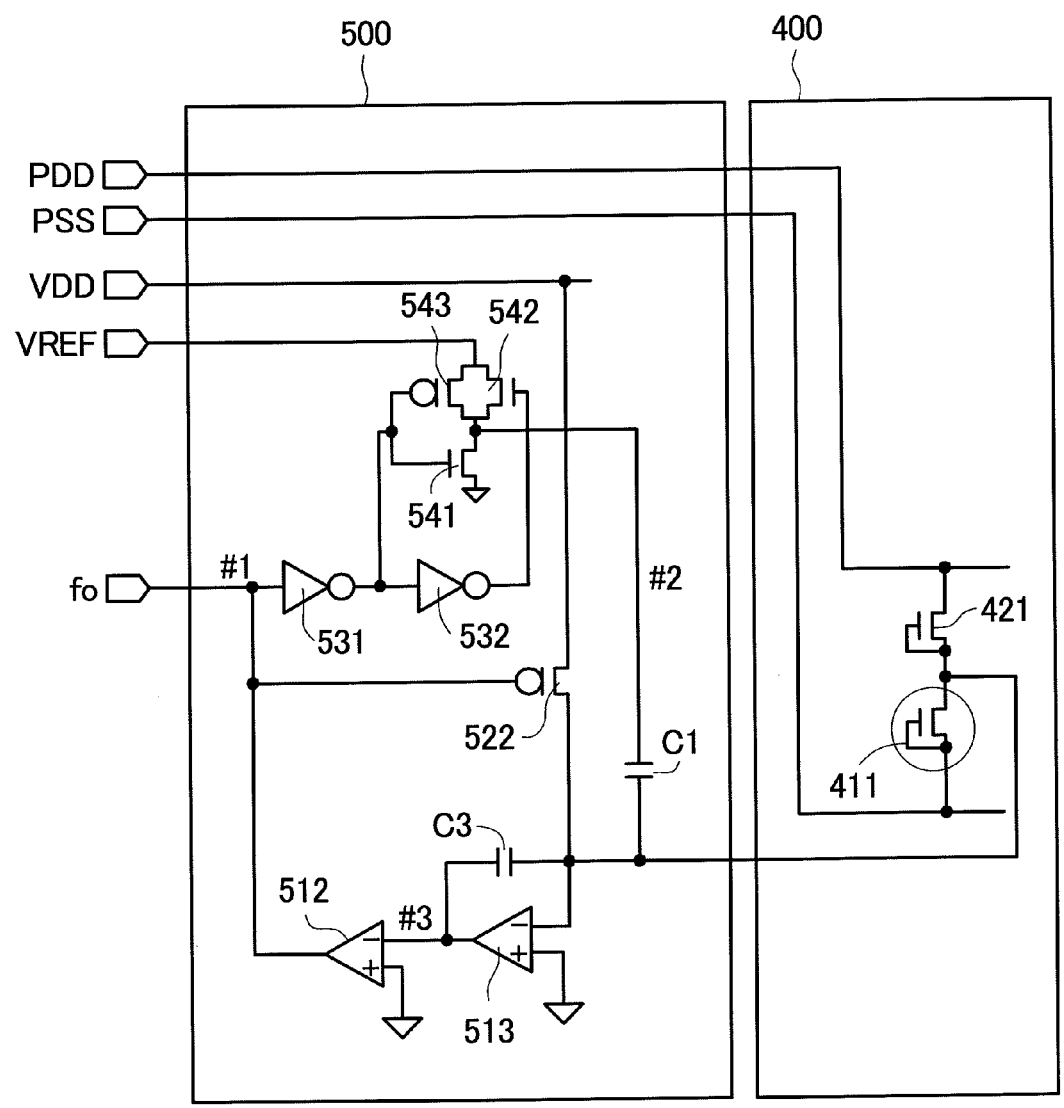
FIG. 7 is a circuit diagram showing another example of the circuit constitution of the photosensor part and the photosensor circuit shown in FIG. 1.

FIG. 7 is a circuit diagram showing another example of the circuit constitution of the photosensor part 400 and the photosensor circuit 500 shown in FIG. 1.

The circuit constitution shown in FIG. 7 differs from the circuit constitution shown in FIG. 3A with respect to a point that the capacitors (C1, C2) of the photosensor part 400 are deleted, the source voltage PSS of the photosensor 411 and the drain voltage PDD of the dark current correction transistor 421 are supplied from the outside, and an operational amplifier 513, an integration capacitor C3 and a capacitor C1 which constitute an integration circuit are added to the photosensor circuit 500.

Figure 8:
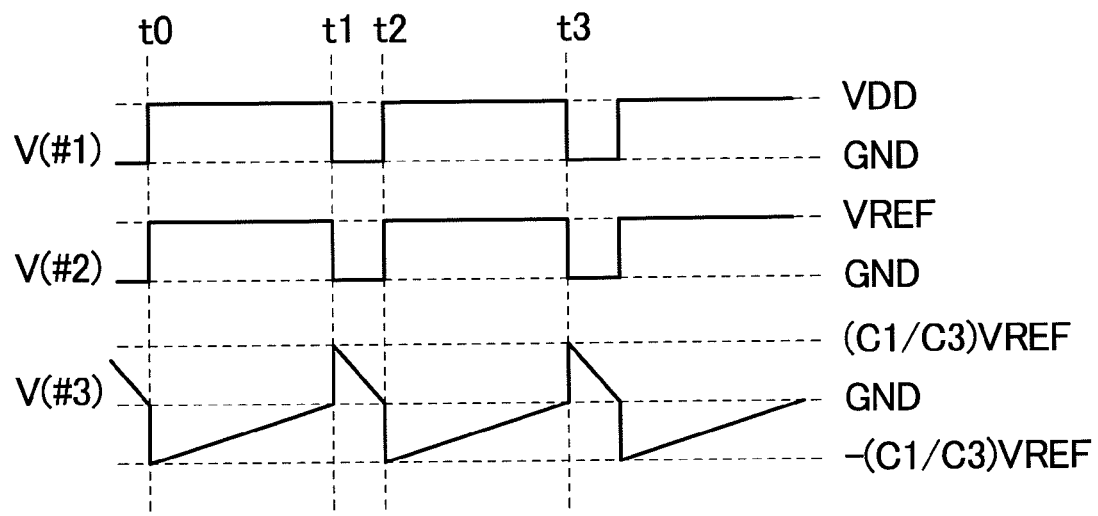
FIG. 8 is a timing chart of the circuit shown in FIG. 7.

FIG. 8 is a timing chart of the circuit shown in FIG. 7.

Symbols V (#1), V (#2), V (#3) shown in FIG. 8 indicate voltages at inner nodes (#1), (#2), (#3) shown in FIG. 7, symbol VDD indicates a power source voltage inputted to a power source terminal, a symbol VREF indicates a reference voltage inputted to a reference voltage terminal, symbol VT indicates a comparison reference voltage inputted to a comparison reference voltage terminal, and symbols PDD, PSS indicate dedicated source voltage and drain voltage for driving the photosensor 411. For example, the drain voltage PDD is 1V and the source voltage PSS is −1V.

During a period from a point of time t0 to a point of time t1, the voltage V (#3) at the node (#3) is smaller than the ground voltage GND and hence, an output of the comparator 512 assumes "H", and the voltage V (#1) at the node (#1) assumes "H".

Accordingly, the PMOS transistor 543 and the NMOS transistor 542 shown in FIG. 7 are turned on, and the NMOS transistor 541 shown in FIG. 7 is turned off and hence, the voltage V (#2) at the node (#2) becomes the reference voltage VREF.

Further, during a period from the point of time t0 to a point of time t1, the PMOS transistor 522 shown in FIG. 7 is turned off.

A charge of the capacitor C3 is discharged in response to an optical current of the photosensor 411 and hence, the voltage V (#3) at the node (#3) is monotonously increased as shown in FIG. 8.

When the voltage V (#3) at the node (#3) at the point of time t1 becomes larger than the ground voltage GND, an output of the comparator 512 assumes "L", and the voltage V (#1) at the node (#1) also assumes "L". Accordingly, the PMOS transistor 543 and the NMOS transistor 542 shown in FIG. 7 are turned off and the NMOS transistor 541 shown in FIG. 7 is turned on and hence, the voltage V (#2) at the node (#2) is changed to the ground voltage GND from the reference voltage VREF.

As a result, the voltage V (#3) at the node (#3) is increased by a voltage ΔV expressed by a following formula (5).

$$\Delta V = VREF \times C1/C3 \quad (5)$$

Further, during the period from the point of time t1 to a point of time t2, the voltage V (#1) at the node (#1) assumes "L" and hence, the PMOS transistor 522 is turned on and hence, the capacitors (C1, C3) are rapidly charged. As a result, the voltage V (#3) at the node (#3) is decreased with time as shown in FIG. 8.

When the voltage V (#3) at the node (#3) at the point of time t2 becomes smaller than the ground voltage GND, the output of the comparator 512 assumes "H" and hence, the voltage V (#1) at the node (#1) assumes "L". Accordingly, the PMOS transistor 543 and the NMOS transistor 542 shown in FIG. 7 are turned on and the NMOS transistor 541 shown in FIG. 7 is turned off and hence, the voltage V (#2) at the node (#2) is changed to the reference voltage VREF from the ground voltage GND.

As a result, the voltage V (#3) at the node (#3) is decreased by the voltage ΔV. The manner of operation of the circuit at a point of time t3 is substantially equal to the manner of operation of the circuit at the point of time t1.

Here, a time t12 from the point of time t1 to the point of time t2 and a time t23 from the point of time t2 to the point of time t3 are expressed by following formulae (6), (7).

$$t12 = C3 \times \Delta V / \text{ion} \quad (6)$$
$$= C1 \times VREF / \text{ion}$$

$$t23 = C3 \times \Delta V / ip \quad (7)$$
$$= C1 \times VREF / ip$$

As can be understood from these formulae (6), (7), the time t12 is inversely proportional to the ON current ion of the PMOS transistor 522, and the time t23 is inversely proportional to the optical current ip. Here, by setting the relationship between the ON current ion and the optical current ip to ion >> ip, a frequency fout of an output fo can be expressed by a following formula (8) in the same manner as the case shown in FIG. 3A.

$$fout = ip/(C1 \times VREF) \quad (8)$$

As can be understood from the formula (8), the output frequency fout is proportional to the optical current ip and is inversely proportional to the reference voltage VREF and the capacitor C1.

Further, in the circuit constitution shown in FIG. 7, a voltage of a connection point between the photosensor 411 and the dark current correction transistor 421 is a voltage at an imaginary ground point and hence, such a voltage is constant irrespective of the operations of the photosensor part 400 and the photosensor circuit 500. As a result, voltages which are applied to the photosensor 411 and the dark current correction transistor 421 can be set based on the voltage PDD and the voltage PSS thus further enhancing the accuracy of dark current correction.

As has been explained heretofore, according to this embodiment, by forming the comparator which requires stability on the semiconductor chip, it is possible to realize the more accurate illuminance detection circuit.

Further, by arranging the control circuit of the backlight 30 in the drain circuit 300 which is mounted by the COG method, the load on the main substrate can be reduced and, at the same time, the number of control signals transmitted to the liquid crystal display panel 10 and the backlight 30 from the control circuit can be reduced. Further, by forming the photosensor 411 on the first substrate, a thickness of a product to which the illuminance detection circuit is applied can be reduced.

In this embodiment, the detection time of the illuminance detection circuit can be shortened when the illuminance is high and can be prolonged when the illuminance is low and hence, the detection accuracy is high. Further, since the dark current can be corrected, it is possible to detect the lower illuminance.

In this manner, according to this embodiment, by controlling the brightness of the backlight corresponding to the illuminance of an external light, it is possible to realize a display device which exhibits excellent visibility.

Here, the application of the illuminance detection circuit of the present invention is not limited to the liquid crystal display device, and the illuminance detection circuit of the present invention is applicable to a display device of other type. Here, when the illuminance detection circuit of the present invention is applied to a self-luminous type display device, the light emitting brightness per se of a display panel is controlled in place of controlling brightness of a backlight.

Although the invention made by inventors of the present invention has been specifically explained in conjunction with the embodiment heretofore, it is needless to say that the present invention is not limited to the above-mentioned embodiment and various modifications are conceivable without departing from the gist of the present invention.

What is claimed is:

1. A display device having an illuminance detection circuit, the illuminance detection circuit comprising:
    a photosensor which changes an optical current in response to illuminance of an external light;
    a capacitor which discharges a charge when the optical current flows in the photosensor;
    a comparator which compares a voltage at one end of the capacitor and a comparison reference voltage;
    a switching circuit which is connected to one end of the capacitor and charges the capacitor in response to a level of an output signal of the comparator; and
    a selection circuit which applies either a first voltage or a second voltage to the other end of the capacitor in response to the level of the output signal of the comparator.

2. A display device according to claim 1, wherein a second capacitor is connected to one end of the capacitor.

3. A display device according to claim 1, wherein the display device includes a transistor which is connected between one end of the capacitor and the photosensor, and a charge of the capacitor is discharged by the photosensor through the transistor.

4. A display device according to claim 1, wherein the display device includes a source follower which is connected between one end of the capacitor and the comparator.

5. A display device having an illuminance detection circuit, the illuminance detection circuit comprising:
    a photosensor which changes an optical current in response to illuminance of an external light;
    a capacitor which discharges a charge when the optical current flows in the photosensor;
    an integration circuit which integrates a voltage at one end of the capacitor;
    a comparator which compares an output of the integration circuit and a comparison reference voltage;
    a switching circuit which is connected to one end of the capacitor and charges the capacitor in response to a level of an output signal of the comparator; and
    a selection circuit which applies either a first voltage or a second voltage to the other end of the capacitor in response to the level of the output signal of the comparator.

6. A display device according to claim 5, wherein the integration circuit includes an operational amplifier, and a second capacitor which is connected between an inverted input terminal and an output terminal of the operational amplifier.

7. A display device according to claim 1, wherein the display device includes a plurality of pixels each of which has a thin film transistor, the photosensor is formed on the same substrate on which the thin film transistors of the respective pixels are formed, and other circuits are formed of a circuit which is formed in the inside of a semiconductor chip.

8. A display device according to claim 1, wherein the display device includes a plurality of pixels each of which includes a thin film transistor, the photosensor and the capacitor are formed on the same substrate on which the thin film transistors of the respective pixels are formed, and other circuits are formed of a circuit formed in the inside of the semiconductor chip.

9. A display device according to claim 1, wherein the display device includes a plurality of pixels each of which includes a thin film transistor, the photosensor, the capacitor and the switching circuit are formed on the same substrate on which the thin film transistors of the respective pixels are formed, and other circuits are formed of a circuit formed in the inside of the semiconductor chip.

10. A display device according to claim 9, wherein the photosensor and the switching circuit are constituted of the thin film transistor of a single channel.

11. A display device according to claim 7, wherein the photosensor is arranged in a dummy pixel part around a display part.

12. A display device according to claim 1, wherein the switching circuit is turned off and the selection circuit applies the first voltage to the other end of the capacitor when the level of the output signal of the comparator is high, and the switching circuit is turned on and the selection circuit applies the second voltage to the other end of the capacitor when the level of the output signal of the comparator is low.

13. A display device according to claim 12, wherein the first voltage is a reference voltage and the first voltage is higher than the second voltage.

14. A display device according to claim 1, wherein the display device includes a dark current correcting transistor which corrects a dark current of the photosensor.

15. A display device according to claim 14, wherein the photosensor and the dark current correcting transistor are driven with a dedicated power source voltage.

\* \* \* \* \*